United States Patent [19]

Verhoeven

[11] Patent Number: 4,843,190

[45] Date of Patent: Jun. 27, 1989

[54] CIRCUIT BOARD SUBSTRATE WITH GOLD PLATED CONTACT ELEMENTS AND A METHOD FOR MOUNTING GOLD PLATED CONTACT ELEMENTS TO THE SUBSTRATE

[75] Inventor: Laurentius M. Verhoeven, Veghel, Netherlands

[73] Assignee: E. I. DuPont De Nemours and Company, Wilmington, Del.

[21] Appl. No.: 61,514

[22] Filed: Jun. 15, 1987

[30] Foreign Application Priority Data

Jun. 17, 1986 [NL] Netherlands ............... 8601567

[51] Int. Cl.$^4$ .................. H05K 3/24; H05K 3/40
[52] U.S. Cl. .................. 174/68.5; 228/180.2; 228/248; 439/83; 29/879
[58] Field of Search ............... 29/879; 228/179, 119, 228/180.2, 248, 170; 439/83; 174/68.5

[56] References Cited

U.S. PATENT DOCUMENTS

| | | | |
|---|---|---|---|
| 3,396,461 | 8/1968 | Spooner et al. | 439/83 X |
| 3,869,787 | 3/1975 | Umbaugh | 228/180.2 |
| 4,081,601 | 3/1978 | Dinella et al. | 174/68.5 |
| 4,132,341 | 1/1979 | Bratschum | 228/248 X |
| 4,728,023 | 3/1988 | Barajas et al. | 228/248 X |

FOREIGN PATENT DOCUMENTS 2164865 7/1972 Fed. Rep. of Germany .
2110204 6/1983 United Kingdom .
2134338 8/1984 United Kingdom .

Primary Examiner—Kenneth J. Ramsey

[57] ABSTRACT

Method of mounting refined contact surfaces on a substrate and substrate provided with such contact surfaces.

A method for mounting contact surface elements on the ends of strip conductors along the edge of a substrate. A solder mixed with adhesive is applied to the soldering surface at ends of the strip conductors. Contact surfaces each having a refined, f.i. gold plated, top surface and an activated, f.i. tin plated, bottom surface, are placed respectively on each soldering surface. Heat is applied to melt the solder particles and provide a good electrical connection between each surface contact and strip conductor. The substrate mounted with the contact elements has a plurality of components mounted on one surface thereof and interconnected by the strip conductors. The substrate is adapted to be plugged into an edge connector along its edge with the mounted contact surface elements.

9 Claims, 2 Drawing Sheets

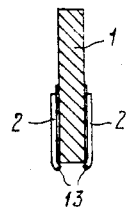
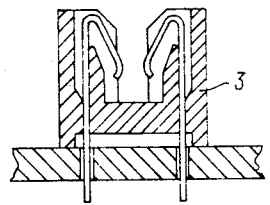
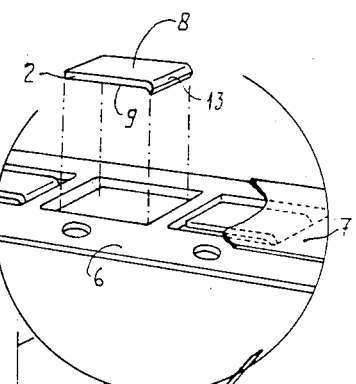
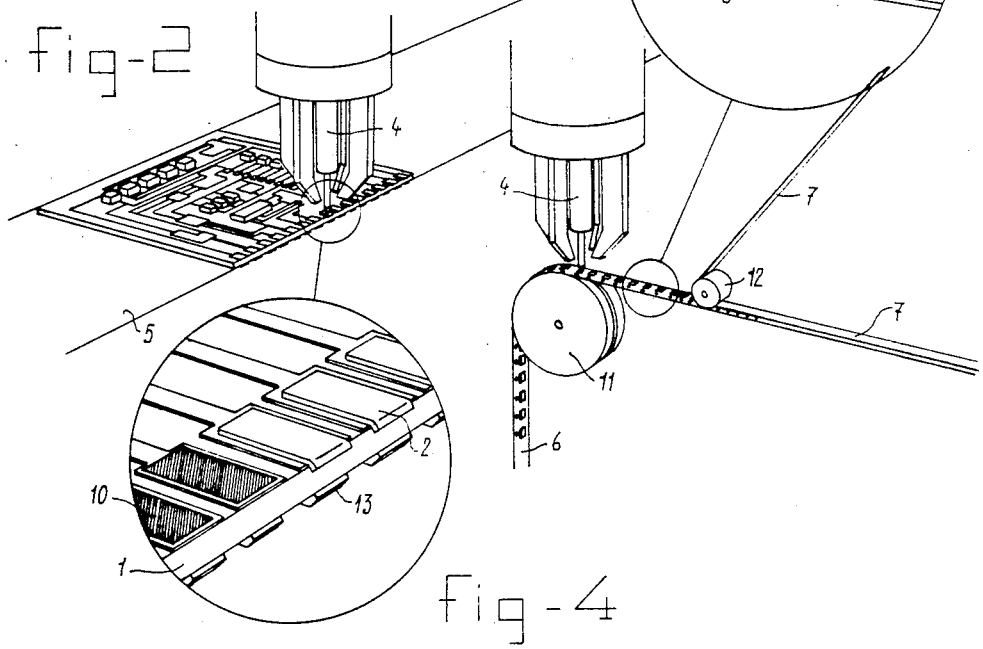
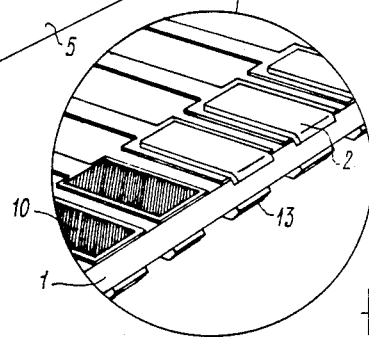

CIRCUIT BOARD SUBSTRATE WITH GOLD PLATED CONTACT ELEMENTS AND A METHOD FOR MOUNTING GOLD PLATED CONTACT ELEMENTS TO THE SUBSTRATE

BACKGROUND OF THE INVENTION

The present invention relates to a substrate having a plurality of components mounted on one surface thereof and particularly to a method for mounting contact surfaces on contact strips which interconnect the components.

In the electronics industry, much use is being made at the present time of substrates on which components connected by strips conductors are mounted. These components are often mounted on the substrates by a relatively new technique known as surface mounting. This technique uses sophisticated pick-up and positioning machines by which the components are mounted on the substrates made of plastics or ceramic boards. In order to hold these components in place for further processing, a solder paste mixed with adhesive is used. Alternatively, the adhesive and the solder paste may be applied separately in the form of two separate substances. To achieve secure fastening, infrared radiation is then applied in such a manner that the resulting induced heat melts the solder particles in the adhesive, thus bringing about an electrical connection between component and substrate.

If often happens in practice that these substrates carrying components connected by strips conductors must be able to function as interchangeable units. The substrates therefore have plug-in edges which are provided with contact surfaces. Preferably, these contact surfaces should be gripped by an edge connector with the smallest possible spring or clamp force. Otherwise, rapid wear may occur or excessive force will be required to make the plug-in connection. In practice, attempts have been made to prevent this by using gold plated contact surfaces. Since this is not practical using current techniques, the contact surfaces are activated by, for example, being tin plated.

SUMMARY OF THE INVENTION

The present invention solves the problems mentioned above by providing a method by which it is possible to mount refined (i.e. gold plated) contact surfaces on a plug-in edge of a substrate in such a manner that very little spring and clamp force is required to enable them to be gripped by an edge connector. The invention also thereby provides a substrate with such refined contact surfaces.

The method of the present invention includes the steps of applying solder paste containing solder particles mixed with adhesive to the ends of strip conductors embedded in the substrate and forming soldering surfaces, placing light prefabricated contact surfaces, whose top or contact side is refined and whose bottom side is activated, on the soldering surfaces, and supplying heat so that the solder particles in the adhesive melt and an electrical connection is made. The adhesive does not interfere with the establishment of a good electrical connection. As noted earlier, the adhesive holds the contact surfaces in place prior to soldering and usually volatizes or otherwise disperses during heating.

Instead of heat induced by infrared radiation, it is also possible to use other heat sources. One can use, for example, the heat of evaporation of a liquid suitable for the purpose, such as an inert fluorinated compound, which has a high evaporation temperature of, for example, 210° C. The resulting layer of heat of evaporation directly above the boiling liquid is used to solder the aforesaid components and/or contact surfaces to the appropriate adhesive surfaces on the substrates. The components and contact surfaces intended for this purpose, which have to soldered to these soldering or adhesive surfaces, are all obviously resistant to high temperatures.

Since both the components and the refined contact surfaces are soldered in one process run to the appropriate adhesive surfaces with the aid of heat from infrared radiation or by the heat of the aforenoted evaporation method, a controlled edge contact surface will be obtained. Since the contact surface has a relatively low weight, the surface tension of the solder flux, such as resin or tin, at the bottom side will have a predominant action in the soldering process. The contact surface or tag will thus center itself, with a resultant equilibrium of forces, during this fastening. Moreover, the contact surface includes a bent inserting side, which engages the substrate edge and through which a self-centering action, directed away from the substrate edge, comes about resulting from the surface tension of the solder flux. In this method, the prefabricated contact surfaces and also the other components for the substrate are fed in a carrier band to the substrate units, which are likewise moved along on a carrier band. With the aid of a sophisticated pick-up and positioning machine, the contact surface is taken from the band and then placed on the appropriate soldering surface on the substrate. The substrate is then moved into an infrared radiation area or into the layer of the heat of evaporation of the liquid boiling beneath it.

BRIEF DESCRIPTION OF THE DRAWINGS

The invention will be further explained with the aid of a preferred embodiment and with reference to the drawings, in which:

FIG. 1 is a cross-sectional view of a substrate provided on its edge with contact surfaces and of an edge connector lying opposite it;

FIG. 2 is a view in perspective of the manner in which a pick-up and positioning machine picks up a contact surface and places it on a substrate for which it is intended;

FIG. 3 is a view in perspective on a larger scale of a part of the band carrying surfaces;

FIG. 4 is a view in perspective on a larger scale of a part of the plug-in edge of the substrate shown in FIG. 2.

DESCRIPTION OF A PREFERRED EMBODIMENT

Figure 5A:
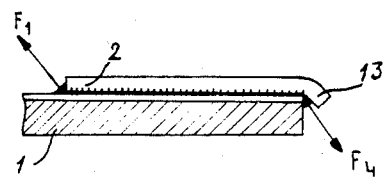
FIGS. 5a, b and c are a cross-sectional view, a front view and a plan view respectively of a contact surface on a soldering surface of a substrate.

FIG. 1 is a cross-sectional view of a substrate 1 which is provided with contact surfaces 2, each having a bent inserting side 13, and which cooperates with a corresponding edge connector 3. In practice, the engagement between the edge connector 3 and the substrate 1 must be made with the least possible clamp or spring force in order to avoid wear and unnecessary plug-in force, while still achieving an excellent electrical connection.

FIG. 2 shows a view in perspective of the manner in which a pick-up and positioning machine 4 picks up a contact surface 2 from a band 6, which runs over a roller 11. Prefabricated contact surfaces 2 are embedded in band 6 at regular intervals. A protective band 7 is unwound from band 6 by means of a roller 12, so that the contact surfaces 2 are exposed. The pick-up and positioning machine 4 then picks up and places each contact surface 2 on an adhesive or soldering surface 10 near the edge of the substrate 1.

As can be seen in FIG. 3, each of the contact surfaces 2 embedded in band 6 consists of a small, tight tag 2, which has a bent inserting side 13. Each contact surface 2 is gold plated on its contact or upper side 8 and is activated at its bottom side 9. This lower surface may be activated by being tin plated, etched, or provided with a solder flux.

As shown in FIG. 4, a solder paste of solder particles mixed with adhesive is applied onto the soldering or adhesive surfaces 10 along the edge of substrate 1. Alternatively, the solder and adhesive may be applied separately on each adhesive surface 10. It is also possible for the above-noted components to be placed on the substrate 1 by means of another or the same pick-up and positioning machine.

The substrate 1 is then subjected to infrared radiation or it is passed along the layer of heat of evaporation of a liquid boiling underneath it. Since the weight of the contact surface 2 is very slight, the surface tension of the liquid tin on the bottom side 9 of the contact surface is predominant. The contact surface, therefore, will have a self-centering action during soldering. The bent inserting side 13, which engages the substrate edge, plays an important role as indicated in FIG. 5.

Figure 5B:
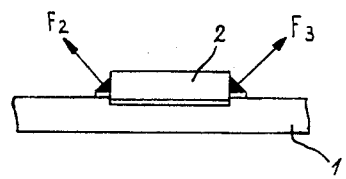
Figure 5C:
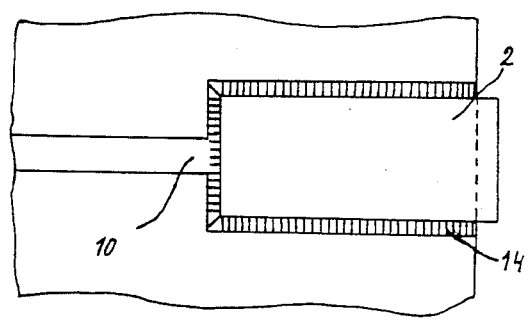

FIGS. 5a, 5b and 5c give a cross-sectional view, a front view and a plan view respectively of a contact surface 2 having a bent inserting side 13 on a soldering pad 10 of the substrate 1. When soldering in reflow (heat of evaporation or radiation) the contact surface floats on the liquid solder, such as tin. As a result of the surface tension of the liquid solder, the forces F1, F2, F3, F4 come about. Thereby a centering force component, directed away from the substrate edge, develops which component urges the bent inserting side 13 against the substrate edge and which centers the contact surface 2 onto the soldering pad 10. The numeral 14 indicates a portion of the solder joint.

It should be understood that above is but a preferred embodiment of the present invention and that various changes may be made without departing from the spirit and scope of this invention.

I claim:

1. A method for mounting contact elements on a surface of a circuit board substrate having a plurality strip conductors formed on said substrate for interconnecting a plurality of components, said method comprising the steps of applying a solder paste containing solder particles and an adhesive to the ends of said strip conductors terminating as contact areas along one edge of said substrate surface to form a plurality of separate solder surfaces, placing a contact element on each of said soldering surfaces, each said contact element being preformed into a substantially flat, rectangular shape except at one side which is bent downward to provide a curved surface for engaging the edge of the substrate, each said contact element having a gold layer at its top surface and an activated bottom surface which faces and contacts the solder surface on the substrate, and applying heat to melt and liquify the solder paste causing said contact element to float on said liquid solder paste, whereby said liquid paste exerts a surface tension against the bottom surface of said contact element, a component force of said surface tension urging the downwardly bent side of said contact element against the edge of the substrate and thereby centering said contact element on said soldering surface.

2. A method according to claim 1, wherein the solder and adhesive are mixed together before being applied to each soldering surface.

3. A method accoridng to claim 1, wherein the solder and adhesive are applied separately to each soldering surface.

4. A method according to claim 1, wherein the heat applied is obtained by subjecting the substrate to infrared radiation.

5. A method according to claim 1, wherein the heat applied is obtained by passing the substrate over a boiling liquid such as an inert fluorinated compound which provides a layer of heat of evaporation above the liquid through which the substrate passes.

6. A method according to claim 1, wherein the plurality of soldering surfaces are disposed at the ends of the embedded strip conductors along the edge of the substrate and the contact elements soldered thereon are intended to provide a plug-in edge for mating with an edge connector.

7. A method according to claim 1 wherein said bottom surface of each contact element may be activated by either being tin plated, etched or provided with a solder flux.

8. A circuit board comprising a substrate and a circuit pattern of strip conductors formed on a surface of said substrate for interconnecting a plurality of components mounted to said substrate, several of said strip conductors terminating as contact areas along an edge of said substrate surface, a solder paste containing solder particles applied to each of said contact areas, a plurality of contact elements mounted along said edge of said substrate surface at said contact areas, each contact element being preformed into a substantially flat, rectangular shape, except at one side which is bent downward to provide a curved surface which engages the edge of the substrate, each said contact element having a gold layer at its top surface facing away from the substrate and a bottom surface facing the board which is activated, each said contact element being centered within its respective contact area during soldering due to a centering force component of the surface tension of the solder which urges the bent side of the contact element against the edge of the substrate.

9. A circuit board according to claim 8 wherein said bottom surface of each contact element may be activated by either being tin plated, etched or provided with a solder flux.

* * * * *